(12) United States Patent
Oh (10) Patent No.: US 11,214,859 B2
(45) Date of Patent: Jan. 4, 2022

(54) COVER WINDOW FOR DISPLAY DEVICE AND MANUFACTURING METHOD THEREOF

(71) Applicant: Samsung Display Co., Ltd., Yongin-si (KR)

(72) Inventor: Byung Chul Oh, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 269 days.

(21) Appl. No.: 16/117,428

(22) Filed: Aug. 30, 2018

(65) Prior Publication Data

US 2019/0071764 A1 Mar. 7, 2019

(30) Foreign Application Priority Data

Sep. 6, 2017 (KR) .................. 10-2017-0114053

(51) Int. Cl.
| | | |
|---|---|---|
| *C23C 14/04* | (2006.01) | |
| *H05K 5/03* | (2006.01) | |
| *C23C 14/20* | (2006.01) | |
| *C23C 14/24* | (2006.01) | |
| *H04M 1/02* | (2006.01) | |
| *G06F 1/16* | (2006.01) | |
| *H05K 5/00* | (2006.01) | |

(52) U.S. Cl.
CPC ............ *C23C 14/042* (2013.01); *C23C 14/20* (2013.01); *C23C 14/24* (2013.01); *G06F 1/1637* (2013.01); *H04M 1/02* (2013.01); *H04M 1/0266* (2013.01); *H05K 5/03* (2013.01); *H04M 1/0202* (2013.01); *H05K 5/0017* (2013.01)

(58) Field of Classification Search
CPC ...................................................... H05K 5/0017
USPC ...................................................... 428/195.1
See application file for complete search history.

(56) References Cited

U.S. PATENT DOCUMENTS

2016/0066456 A1* 3/2016 Min .................. G06F 1/16
428/172

FOREIGN PATENT DOCUMENTS

| KR | 10-2014-0071093 | 6/2014 |
|---|---|---|
| KR | 10-2016-0028595 | 3/2016 |
| KR | 10-2016-0093173 | 8/2016 |
| KR | 10-1716569 | 3/2017 |

* cited by examiner

*Primary Examiner* — Ian A Rummel
(74) *Attorney, Agent, or Firm* — Lewis Roca Rothgerber Christie LLP (57) ABSTRACT

A cover window for a display device and a method of manufacturing the same are provided. The cover window for a display device includes a light-transmitting substrate, a mold layer on at least a part of an edge of the light-transmitting substrate, and having an uneven pattern formed on a surface thereof, an inorganic material pattern layer on the mold layer and exposing a portion of the mold layer, and a print layer on the mold layer and covering the exposed portion of the mold layer.

11 Claims, 13 Drawing Sheets

COVER WINDOW FOR DISPLAY DEVICE AND MANUFACTURING METHOD THEREOF

CROSS-REFERENCE TO RELATED APPLICATION

This application claims priority to, and the benefit of, Korean Patent Application No. 10-2017-0114053, filed on Sep. 6, 2017, in the Korean Intellectual Property Office, the disclosure of which is incorporated herein by reference in its entirety.

BACKGROUND

1. Field

Embodiments of the present invention relate to a cover window for a display device and a manufacturing method thereof.

2. Description of the Related Art

A display device is a device that displays an image using an organic light emitting element, a liquid crystal element, or the like. The display device is applied to TVs, monitors, notebooks, tablet PCs, mobile phones, and the like.

The display device may include a cover window for protecting a display panel. Mobile phones and tablet PCs are easily exposed to external environments because they can be used while being mobile, and also because they continuously receive external forces when a touch function is added. Therefore, the function of a cover window is more important.

Generally, the back surface of the cover window may be provided with patterns for allowing the non-display area of the cover window to be reflective, metallic, or glossy. For example, when a resin layer having a concavo-convex pattern on its surface and a layer formed by depositing an inorganic material are disposed together, reflective or glossy properties can be realized.

However, an offset in which the sizes of the resin layer and the deposition layer do not coincide with each other may occur in an actual process of manufacturing the cover window. This may cause a golden band to be visually recognized in the cover window, or may cause visibility to be deteriorated in the cover window.

SUMMARY

Accordingly, to solve the above, an aspect of embodiments of the present invention provides a cover window for a display device, which can prevent a phenomenon in which a golden band is visually recognized or in which visibility is deteriorated.

However, aspects of embodiments of the present invention are not restricted to the one set forth herein. The above and other aspects of embodiments of the present invention will become more apparent to one of ordinary skill in the art to which embodiments of the present invention pertain by referencing the detailed description given below.

According to one embodiment of the present invention, a cover window for a display device includes a light-transmitting substrate, a mold layer on at least a part of an edge of the light-transmitting substrate, and having an uneven pattern formed on a surface thereof, an inorganic material pattern layer on the mold layer and exposing a portion of the mold layer, and a print layer on the mold layer and covering the exposed portion of the mold layer.

The exposed portion may include a part of an inner side of the mold on a plane.

The print layer may cover at least a part of the inorganic material pattern layer.

The print layer may completely cover the mold layer and the inorganic material pattern layer.

An inner line of the print layer may overlap an inner line of the mold layer on a plane.

The mold layer may be entirely located on a pair of opposite edges of the light-transmitting substrate.

A flat mold layer having only smooth surfaces may be on an edge of the light-transmitting substrate, the edge not being provided thereon with the patterned mold layer.

The print layer may be on all edges of the light-transmitting substrate.

The print layer may include a color for substantially blocking visible light.

The cover window may further include a masking print layer on the inorganic material pattern layer, and completely overlapping the inorganic material pattern layer.

The print layer may cover at least a part of the masking print layer.

According to another embodiment of the present invention, a method of manufacturing a cover window for a display device includes forming a mold layer having an unevenly patterned surface on at least a part of an edge of a light-transmitting substrate, depositing an inorganic material onto the light-transmitting substrate to form an inorganic material deposition layer covering the entire surface of the light-transmitting substrate and the mold layer, forming a first print layer on a part of an area where the inorganic material deposition layer overlaps the mold layer, etching the inorganic material deposition layer using the first print layer as a mask to form an inorganic material pattern layer from which a portion where the first print layer is not formed is removed, and forming a second print layer covering a portion of the mold layer exposed by removing the inorganic material deposition layer.

The first print layer and the second print layer may be formed by printing an ink having a color for substantially blocking visible light.

Forming the mold layer may include irradiating a photo-curable resin with light.

The mold layer may be formed only on a pair of corresponding edges of the light-transmitting substrate.

A mold layer having a flat surface may be on an edge of the light-transmitting substrate, the edge not being provided thereon with the mold layer.

The second print layer may be on all edges of the light-transmitting substrate.

Etching the inorganic material deposition layer may expose at least a part of an inner side of the mold layer on a plane.

The second print layer may cover at least a part of the first print layer.

Forming the second print layer may include completely covering the mold layer, the inorganic material pattern layer, and the first print layer.

BRIEF DESCRIPTION OF THE DRAWINGS

The above and other aspects of embodiments of the present invention will become more apparent by describing in detail embodiments thereof with reference to the attached drawings, in which.

DETAILED DESCRIPTION

Features of the inventive concept and methods of accomplishing the same may be understood more readily by reference to the following detailed description of embodiments and the accompanying drawings. Hereinafter, embodiments will be described in more detail with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
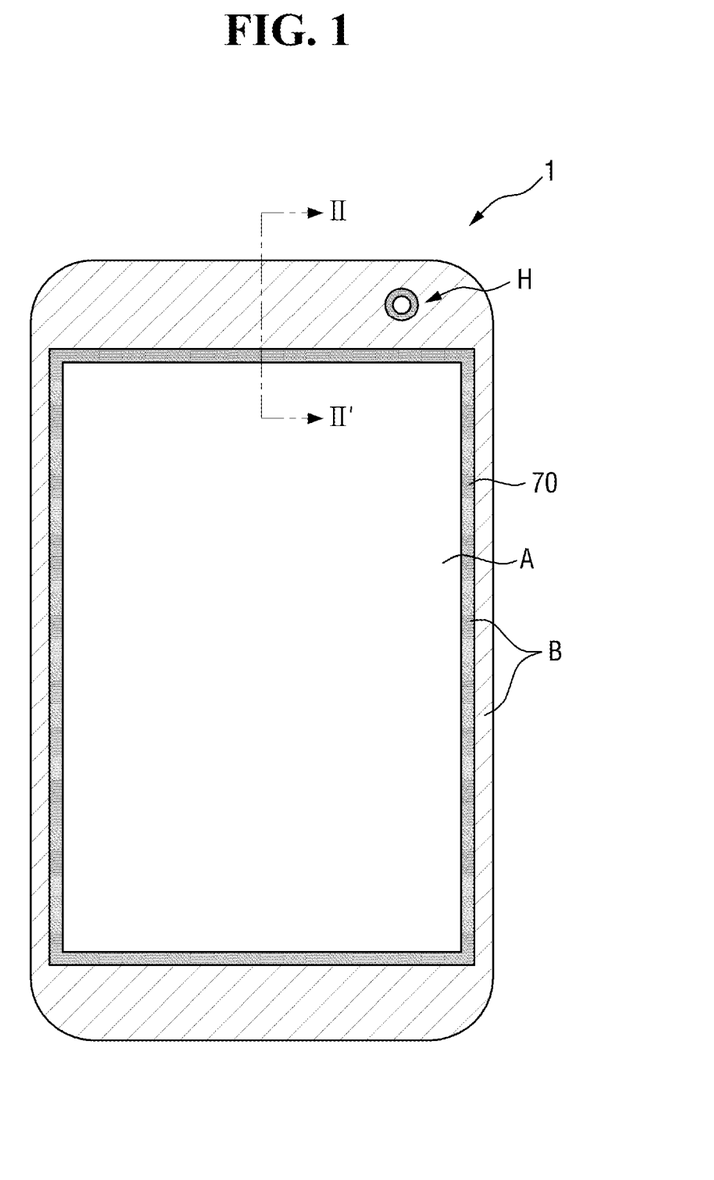
FIG. 1 is a plan view of a cover window for a display device according to an embodiment of the present invention.
Figure 2:
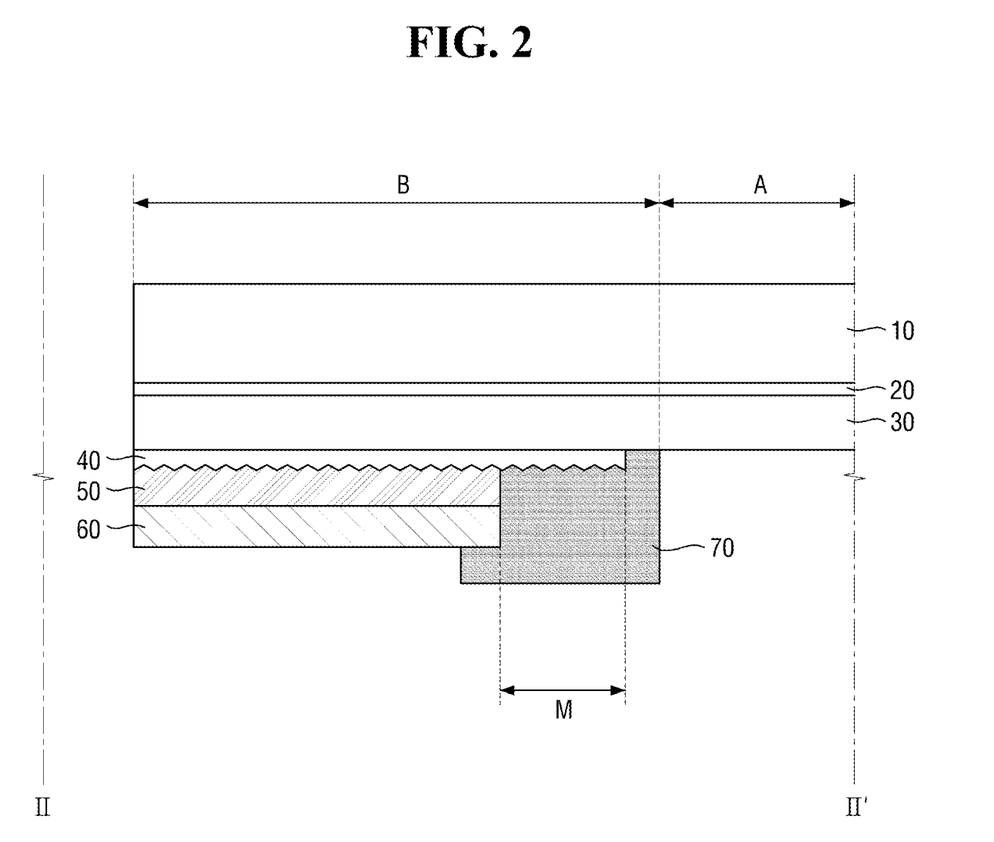
FIG. 2 is a sectional view taken along the line II-II' in FIG. 1.

FIG. 1 is a plan view of a cover window for a display device according to an embodiment of the present invention, and FIG. 2 is a sectional view taken along the line II-II' in FIG. 1.

Referring to FIG. 1, the cover window 1 for a display device includes a first area A and a second area B one a plane. The second area B is on the periphery of the first area A. As shown in FIG. 1, when the first area A is formed in a rectangular shape, the second area B may be on the outer side along the edge of the first area A.

The first area A may be a light-transmitting are capable of transmitting visible light, and the second are B may be a light-blocking area substantially blocking the transmission of visible light. When the cover window 1 is coupled to a display panel, the first area A of the cover window 1 may be a display area where the image that is output from the display panel is visually recognized, and the second area B may be a non-display area where the image is not visually recognized.

At an inner edge of the second area B, at least a part of a second print layer 70 on a back surface of the cover window 1 can be seen from a front direction of the cover window 1. Unless otherwise described herein, a "front surface" of the cover window 1 refers to a surface that is visibly recognized in the drawing in the plan view, such as in FIG. 1, and refers to a surface facing upward in the sectional view, such as in FIG. 2. The "back surface" refers to a surface that is opposite to the front surface. Details of the second print layer 70 will be described later.

A light-transmitting hole H may be formed in a part of the second area B. The light-transmitting hole H may be an area corresponding to a camera module, an optical sensor, or the like, which may be incorporated in the display device. The light-transmitting hole H may be an area where only the light-transmitting member of the cover window 1 is located, and may be an area that has substantially the same structure as the first area A. However, the present invention is not limited thereto, and the light-transmitting hole H may be a portion formed through, or defined by, the cover window 1.

Hereinafter, a specific structure of the cover window 1 for a display device will be described with reference to sectional views.

Referring to FIG. 2, the cover window 1 of a display device includes a light-transmitting substrate/transparent substrate 10, a mold layer 40 on the back surface of the light-transmitting substrate 10, an inorganic material pattern layer 50 on the mold layer 40, and a second print layer 70 on the mold layer 40. The cover window 1 may further include an adhesive layer 20 and a film layer 30, which are disposed between the light-transmitting substrate 10 and the mold layer 40, and a first print layer 60 on the inorganic material pattern layer 50.

The second area B of the cover window 1 may be defined as an area where the mold layer 40, the inorganic material pattern layer 50, the first print layer 60, and the second print layer 70 are located.

The light-transmitting substrate 10 may be a base substrate capable of supporting the components of the cover window 1 by providing a space where the mold layer 40, the inorganic material pattern layer 50, and the like are on a back surface thereof.

The light-transmitting substrate 10 may be made of a transparent material, such as glass, to enable the substantial transmission of visible light. However, the present invention is not limited thereto, and the light-transmitting substrate 10 may contain a transparent polymer material, such as polyethylene terephthalate (PET) or polymethyl methacrylate (PMMA).

When the cover window 1 is coupled to the display panel, the light provided from the display panel can be transmitted upward from the back/lower surface of the light-transmitting substrate 10 with reference to FIG. 2.

The adhesive layer 20 and the film layer 30 may be on the back surface of the light-transmitting substrate 10. The adhesive layer 20 may serve to attach and fix the film layer 30 to the light-transmitting substrate 10, and the film layer 30 may be provided as a base surface on which components of the cover window 1 are located. Both the adhesive layer 20 and the film layer 30 may be made of a light-transmitting material.

The adhesive layer 20 may include an optical clear adhesive (OCA) or an optical clear resin (OCR). The optical clear adhesive (OCA) and the optical clear resin (OCR) may be a pressure sensitive adhesive (PSA). However, the present invention is not limited thereto.

The film layer 30 may contain a transparent polymer material such as polyethylene terephthalate or polymethyl methacrylate. However, the present invention is not limited thereto.

The mold layer 40 may be on the film layer 30. The mold layer 40 may be on at least a part of the edge of the cover window 1. FIGS. 1 and 2 illustrate a case where the mold layer 40 is on the entire edge of the cover window 1. The mold layer 40 may be in an area substantially corresponding to the second area B.

Referring to FIG. 2, the mold layer 40 may be provided with an uneven pattern formed on a lower surface thereof. In an embodiment, the uneven pattern formed on the lower surface of the mold layer 40 may be a hair-line pattern that is visually recognized as a planar thin line pattern, but is not limited thereto.

The uneven pattern formed on the lower surface of the mold layer 40 may serve to realize the reflective properties and gloss of the second area B together with the inorganic material pattern layer 50 to be described later. The mold layer 40 may be a layer formed by photocuring a photocurable resin.

The inorganic material pattern layer 50 may be on the mold layer 40. The inorganic material pattern layer 50 may expose at least a part of the mold layer 40. Therefore, the inorganic material pattern layer 50 and the mold layer 40 might not completely overlap each other. FIG. 2 illustrates a case where the inorganic material pattern layer 50 exposes a part (M) of the inner side (right side in FIG. 2) of the mold layer 40 on a plane. That is, in the present embodiment, the inorganic material pattern layer 50 is not on a part of the inner side of the mold layer 40 by a margin (e.g., a predetermined margin) M, and thus, the inner side of the mold layer 40 may protrude toward the inner side of the cover window 1 further than the inner side of the inorganic material pattern layer 50.

The inorganic material pattern layer 50 may contain an inorganic material, such as a metal, a metal oxide, or a non-metal oxide. The inorganic material pattern layer 50 may be a layer formed by depositing an inorganic material on the entire surface of the cover window 1, and by then etching the deposited inorganic material. In an embodiment, the inorganic material pattern layer 50 may be formed by a non-conductive vacuum metallization (NCVM) process, but is not limited thereto.

The inorganic material pattern layer 50 may be directly on one surface of the mold layer 40 to allow the second area B to have reflective properties and gloss.

The first print layer 60 may be on the inorganic material pattern layer 50. The first print layer 60 may be a masking print layer that can be used as an etching mask in the process of forming the inorganic material pattern layer 50. Accordingly, the first print layer 60 may completely overlap the inorganic material pattern layer 50. That is, on a plane, the area of the first print layer 60 may be substantially the same as the area of the inorganic material pattern layer 50.

The first print layer 60 may be a layer formed by printing an ink having a color capable of substantially blocking the transmission of a visible light, such as black light or blue light. That is, the first print layer 60 may be a light-blocking pattern layer. The first print layer 60 may be formed by screen-printing such a light-blocking ink, but the present invention is not limited thereto.

The second print layer 70 may be on the mold layer 40. The second print layer 70 may cover the exposed portion of the mold layer 40 because the inorganic material pattern layer 50 is not on the exposed portion of the mold layer 40. Therefore, the exposed portion of the mold layer 40 may be in direct contact with the second print layer 70.

Similarly, the second print layer 70 may be a layer formed by printing an ink having a color capable of substantially blocking the transmission of a visible light such as black light or blue light. The inks of the first print layer 60 and the second print layer 70 may be the same or different in color. However, the present invention is not limited thereto.

When the inorganic material pattern layer 50 is also in an area where the mold layer 40 is not located, it can be visually recognized as a golden band at the front face of the cover window 1. If the inorganic material pattern layer 50 does not entirely cover the mold layer 40, visibility may be deteriorated. To prevent such a phenomenon, the mold layer 40 and the inorganic material pattern layer 50 may completely overlap each other. However, any one of the mold layer 40 and the inorganic material pattern layer 50 may be extended or shortened by a margin or offset in an actual process.

Accordingly, in the present embodiment, when forming the inorganic material pattern layer 50, the inorganic material pattern layer 50 may be intentionally formed to be narrower than the mold layer 40 by a margin (e.g., a predetermined margin) M, and the exposed portion of the mold layer 40 may be covered with the second print layer 70. Thus, a golden band phenomenon, which otherwise occurs when only the inorganic material pattern layer 50 is present, can be reduced or prevented, and a portion of the mold layer 40 that is not provided with the inorganic material pattern layer 50, may be covered with the light-blocking second print layer 70 so as not to negatively affect visibility.

The second print layer 70, as shown in FIG. 2, may cover a part of the first print layer 60, and may also directly contact a part of the film layer 30. However, the present invention is not limited thereto, and the arrangement structure of the second print layer 70 may be modified, as with other embodiments to be described later.

The above-described structure may be applied to the light-transmitting hole H and the second area B adjacent thereto. Similarly, through this structure, the golden band phenomenon and the deterioration of visibility can be prevented.

Figure 3:
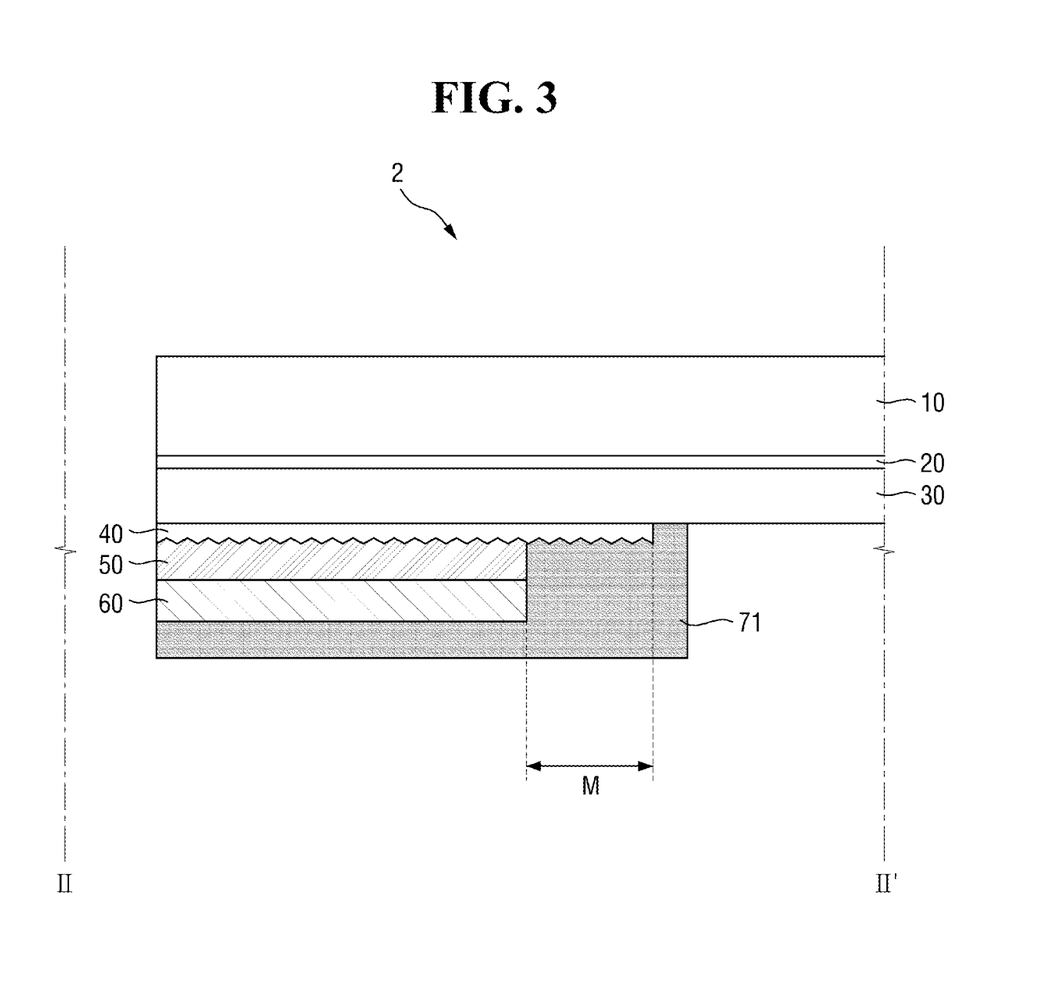
FIGS. 3 to 5 are sectional views of cover windows for a display device according to other embodiments of the present invention.

FIG. 3 is a sectional view of a cover window 2 for a display device according to another embodiment of the present invention.

The cover window 2 of FIG. 3 is the same as the cover window 1 of FIGS. 1 and 2, except that a second print layer 71 covers the entire first print layer 60. Hereinafter, a redundant description will be omitted.

Referring to FIG. 3, the second print layer 71 may cover the entire first print layer 60, as opposed to only a part of the first print layer 60. Thus, the second print layer 71 may completely cover the mold layer 40 and the first print layer 60.

Figure 4:
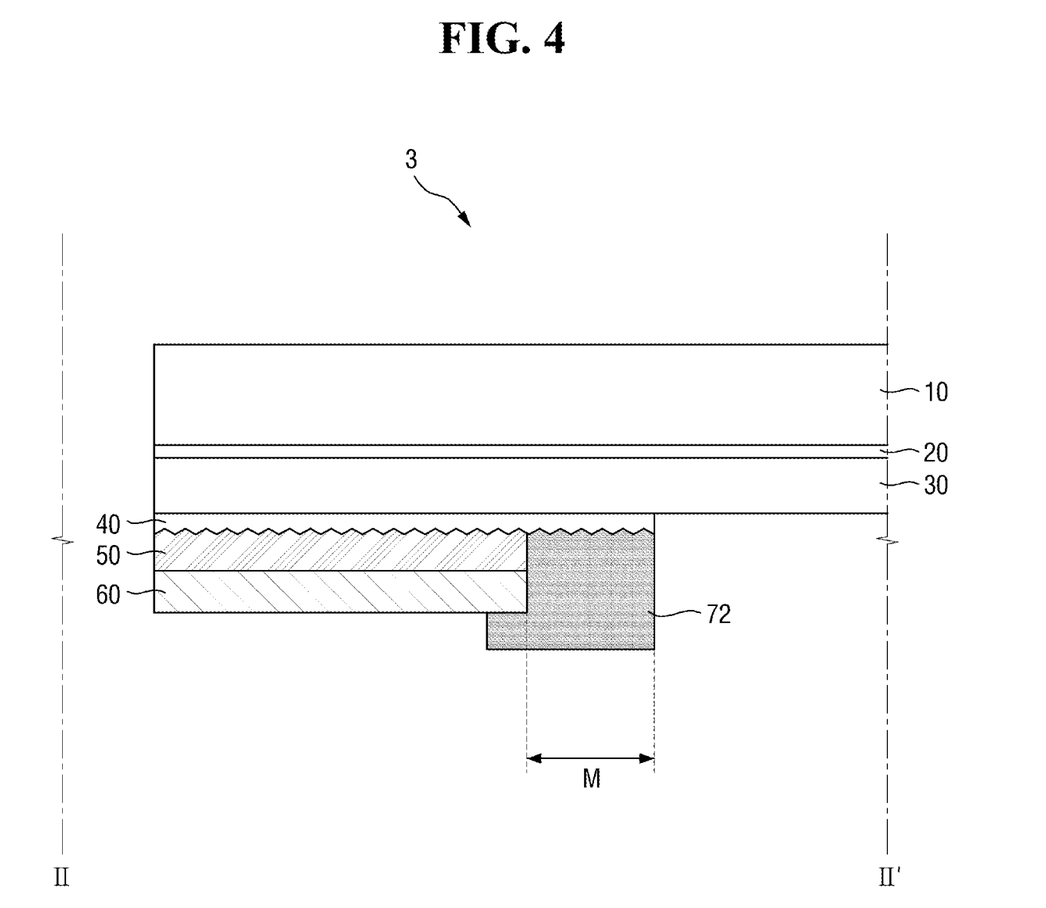

FIG. 4 is a sectional view of a cover window 3 for a display device according to another embodiment of the present invention.

The cover window 3 of FIG. 4 is the same as the cover window 1 of FIGS. 1 and 2, except that an inner edge of a second printed layer 72 and an inner edge of the mold layer 40 are located on a straight line. Hereinafter, a redundant description will be omitted.

Referring to FIG. 4, the inner line of the second printed layer 72 and the inner line of the mold layer 40 are aligned, or located on a straight line. In this case, the inner line of the second printed layer 72 and the inner line of the mold layer 40 may substantially overlap each other on the plane, or in a plan view.

Figure 5:
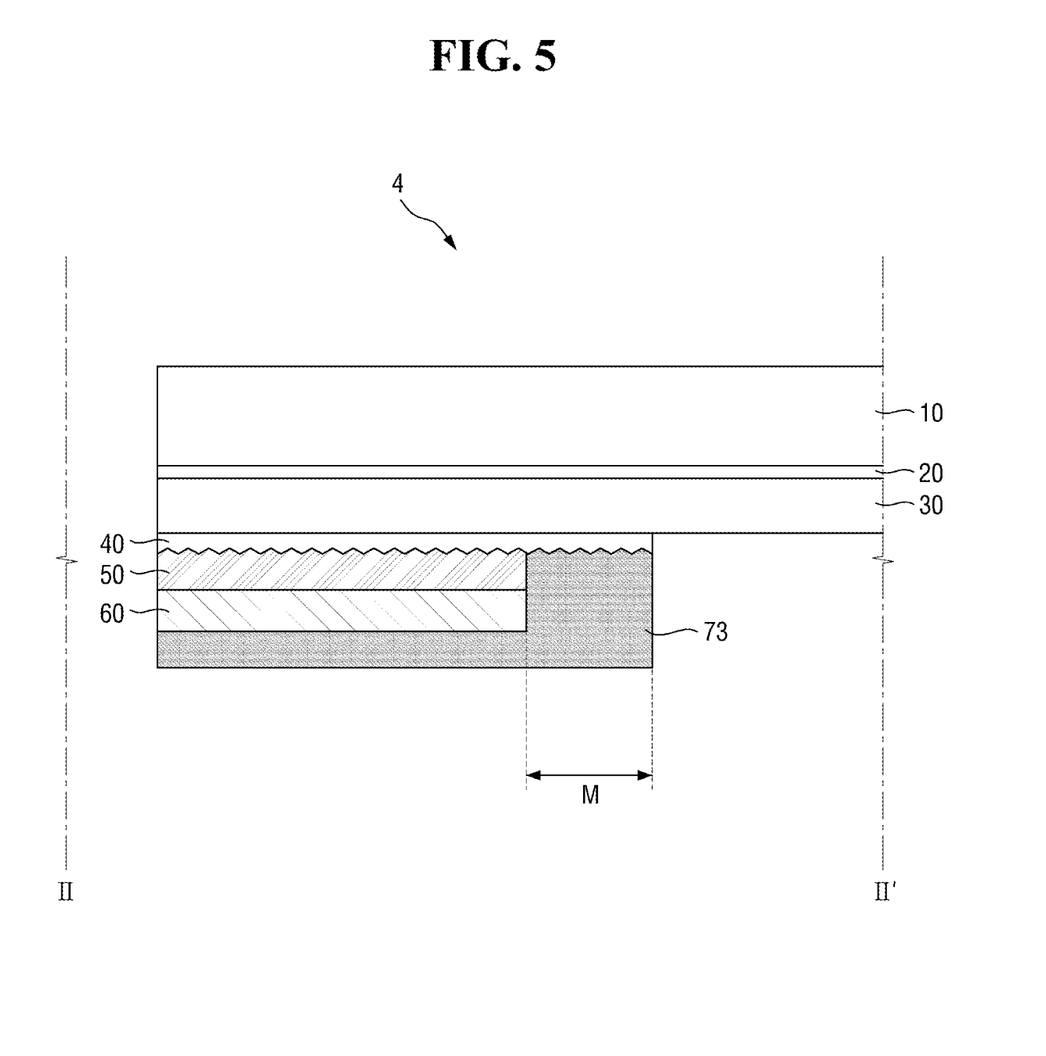

FIG. 5 is a sectional view of a cover window 4 for a display device according to another embodiment of the present invention.

The cover window 4 of FIG. 5 is the same as the cover window 1 of FIGS. 1 and 2, except that a second print layer 73 covers the entire first print layer 60 as shown in FIG. 3, and the inner line of the second print layer 73 and the inner line of the mold layer 40 are located on a straight line as shown in FIG. 4. Hereinafter, a redundant description will be omitted.

Figure 6:
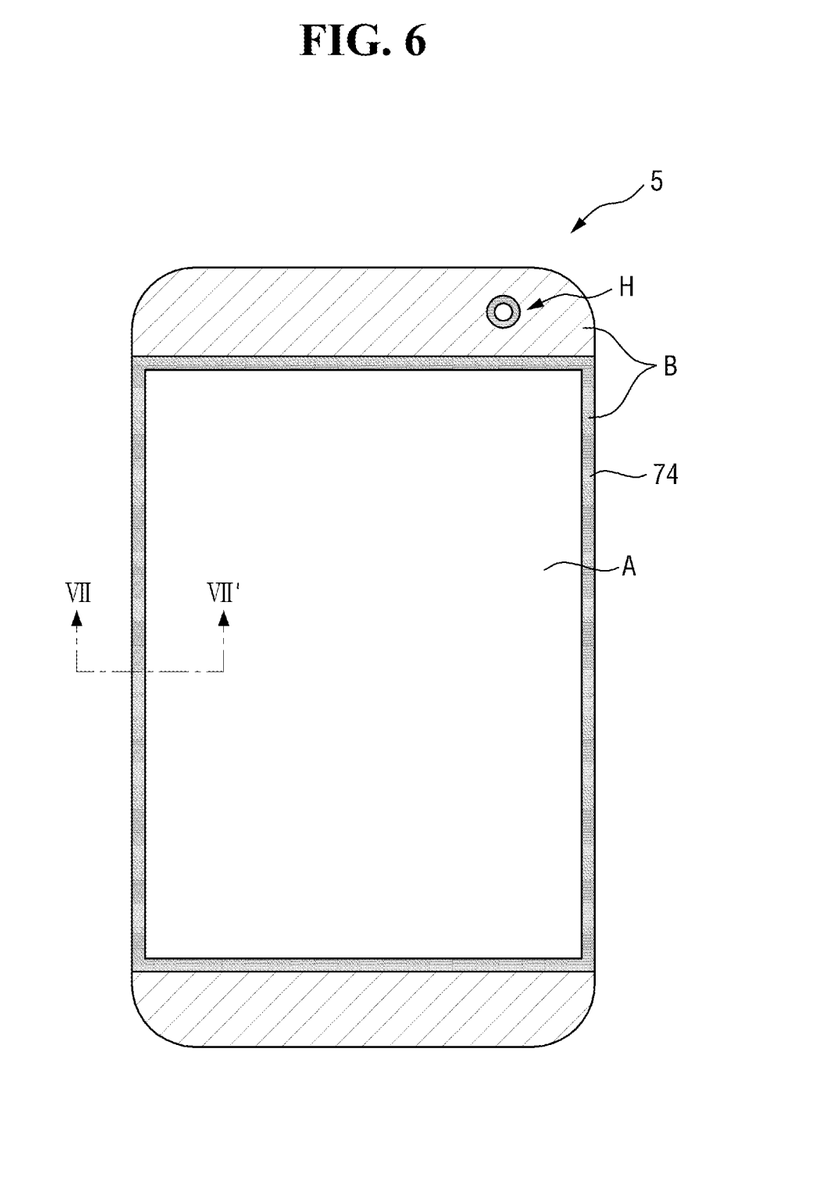
FIG. 6 is a plan view of a cover window for a display device according to another embodiment of the present invention.
Figure 7:
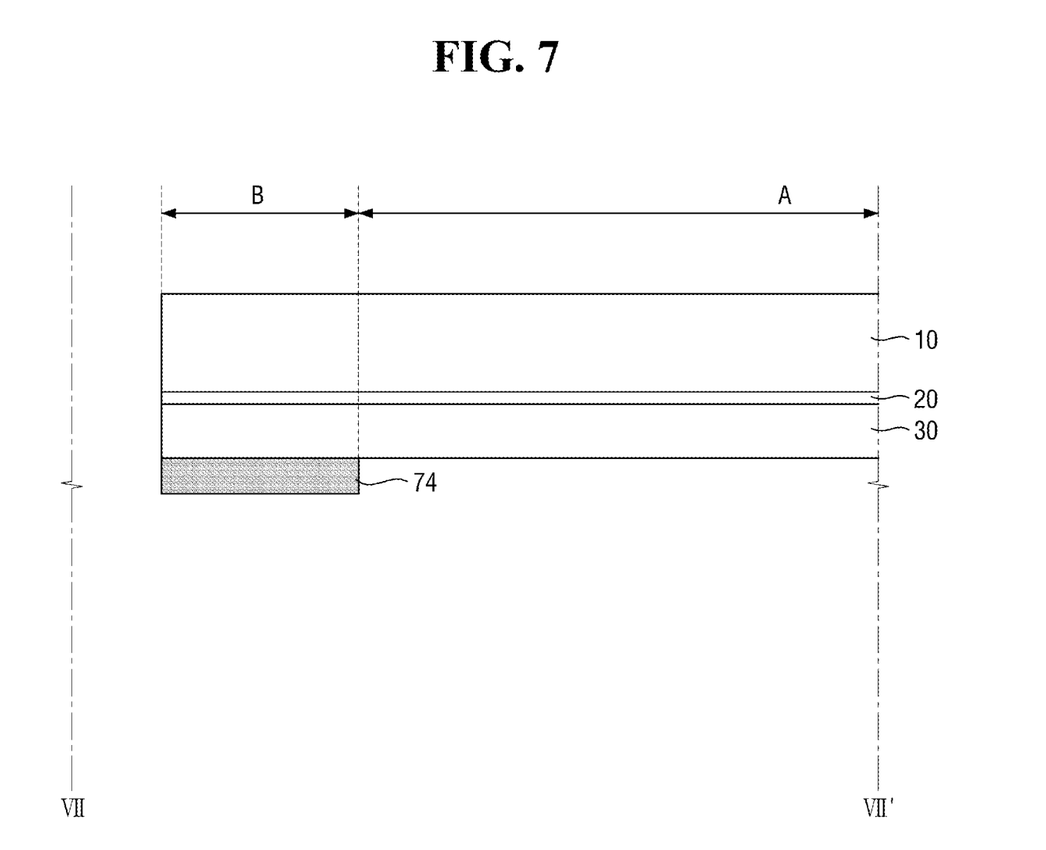
FIG. 7 is a sectional view taken along the line VII-VII' in FIG. 6.

FIG. 6 is a plan view of a cover window 5 for a display device according to another embodiment of the present invention, and FIG. 7 is a sectional view taken along the line VII-VII' in FIG. 6.

The cover window 5 of FIGS. 6 and 7 is the same as the cover window 1 of FIGS. 1 and 2, except that the mold layer 40, the inorganic material pattern layer 50, and the first print layer 60 are only on a pair of edges corresponding to each other of the cover window 5. Hereinafter, a redundant description will be omitted.

Referring to FIGS. 6 and 7, the mold layer 40, the inorganic material pattern layer 50, and the first print layer 60 may be omitted from the left and right edges of the second area B of the cover window 5. That is, the mold layer 40, the inorganic material pattern layer 50, and the first print layer 60 may instead be only on the upper and lower edges of the cover window 5. For example, only a second print layer 74 may be on the left and right edges of the second area B to define the second area B. Accordingly, only the upper and lower edges of the cover window 5 may be configured to exhibit reflective properties or gloss. Because the sectional structure at the upper and lower edges of the cover window 5 is substantially the same as that in FIGS. 1 and 2, a description thereof will be omitted.

Figure 8:
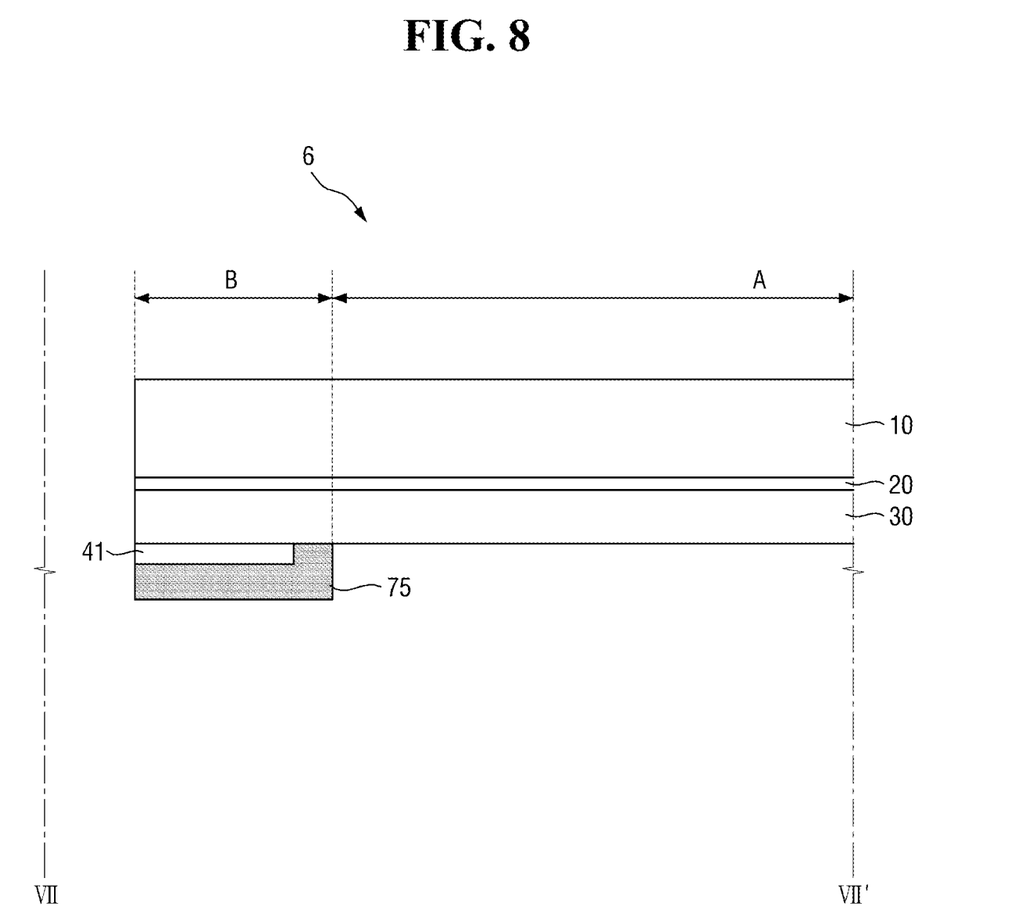
FIG. 8 is a sectional view of a cover window for a display device according to another embodiment of the present invention.

FIG. 8 is a sectional view of a cover window 6 for a display device according to another embodiment of the present invention.

The cover window 6 of FIG. 8 is the same as the cover window 5 of FIGS. 6 and 7, except that a flat mold layer 41 is further on left and right edges. Hereinafter, a redundant description will be omitted.

Referring to FIG. 8, the flat mold layer 41 having a smooth surface may be on the left and right edges of the cover window 6 where the mold layer 40, the inorganic material pattern layer 50, and the like are not located. Because the flat mold layer 41 has a low surface roughness, and thus substantially no pattern is formed on the surface thereof, reflective properties or gloss may not be generated, unlike the mold layer 40 in which an uneven pattern is formed on the surface thereof.

The flat mold layer 41 may be on the back surface of the film layer 30, and the second print layer 75 may cover the flat mold layer 41.

FIGS. 9 to 14 are sectional views illustrating a process of manufacturing the cover window 1 for a display device in a stepwise manner according to an embodiment of the present invention.

Figure 9:
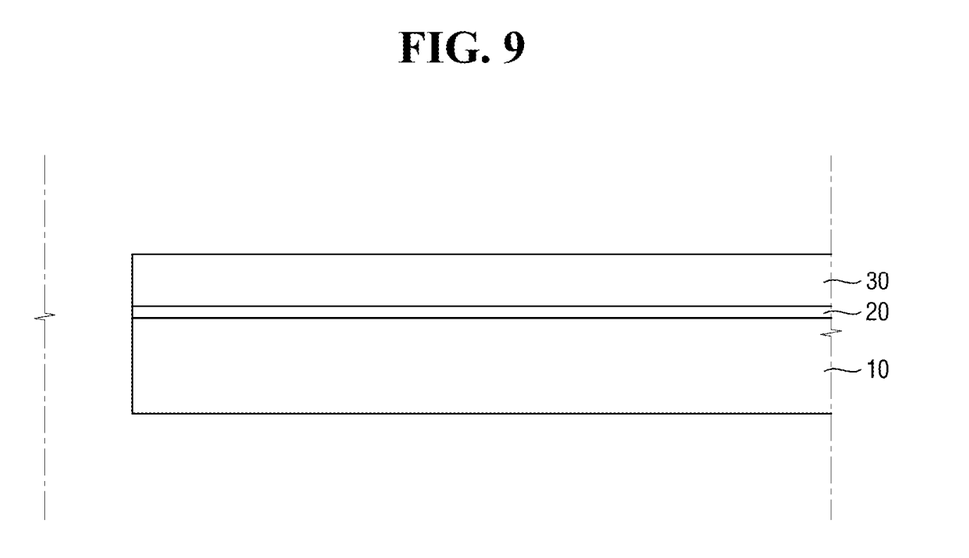
FIGS. 9 to 14 are sectional views illustrating a process of manufacturing a cover window for a display device in a stepwise manner according to an embodiment of the present invention.

Referring to FIG. 9, first, a film layer 30 is attached to one surface of a light-transmitting substrate 10 through an adhesive layer 20. The planar area of the light-transmitting substrate 10 may be substantially the same as the planar area of the film layer 30.

Figure 10:
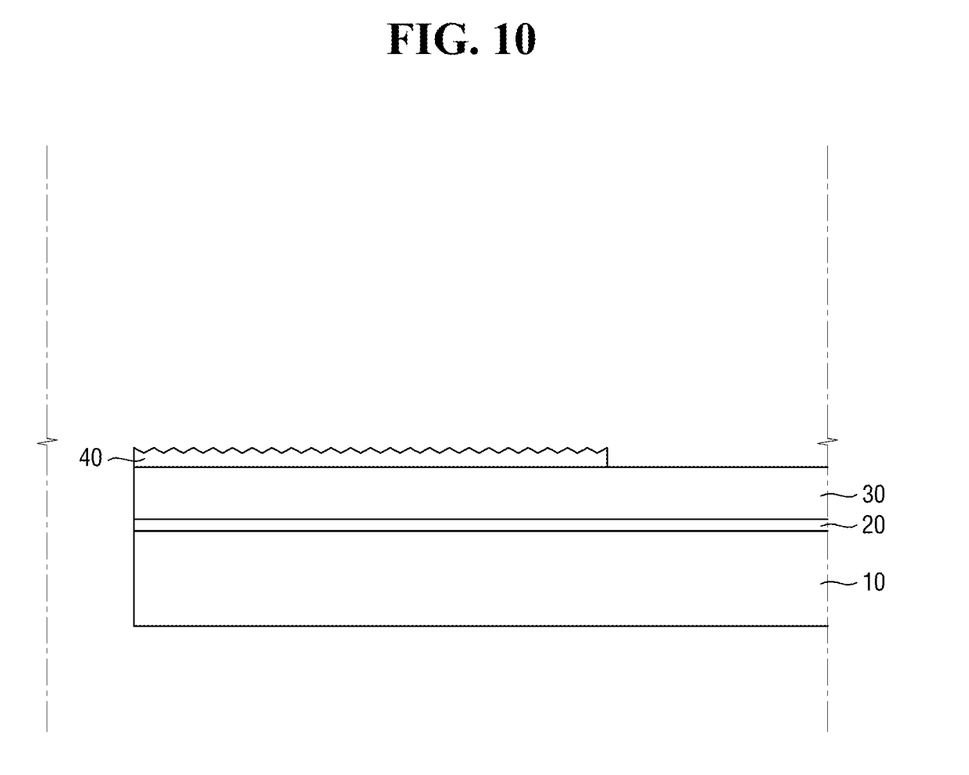

Referring to FIG. 10, next, a mold layer 40 is formed on the film layer 30. Further, In addition, an uneven pattern is formed on the surface of the mold layer 40. The surface pattern of the mold layer 40 may be formed separately after the formation of the mold layer 40, or may be formed simultaneously with the formation of the mold layer 40.

In an embodiment, a photocurable resin, which is a material for the mold layer 40, is applied onto one surface of the film layer 30, a separate mold having a uneven surface was pressed thereon, and then the resin is irradiated with light to cure the resin, thereby forming the mold layer 40 having an uneven pattern formed on the surface thereof. However, the present invention is not limited thereto.

The mold layer 40 may be formed to cover all of the edges of the light-transmitting substrate 10, but the present invention is not limited thereto. In other embodiments, the mold layer 40 may be formed only on a pair of edges corresponding to each other, as shown in FIG. 6, and the like.

Figure 11:
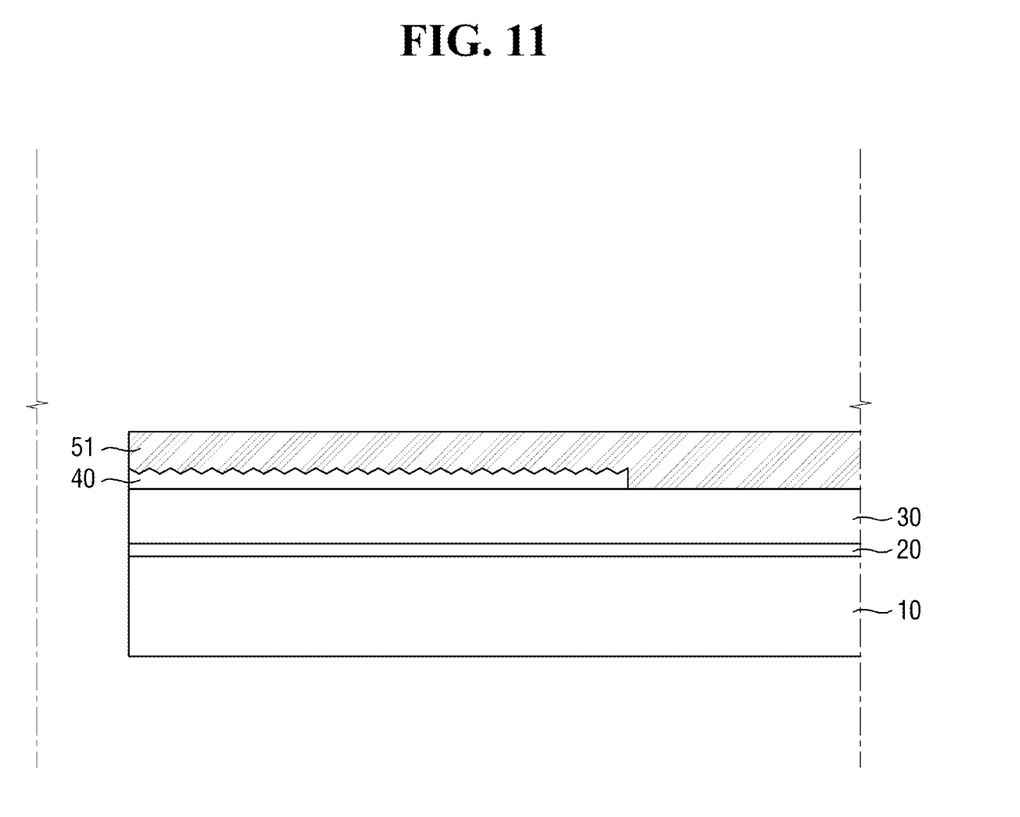

Referring to FIG. 11, next, an inorganic deposition layer 51 is formed to cover the entire surface of the mold layer 40 and the film layer 30. The inorganic deposition layer 51 may be formed by depositing an inorganic material on the mold layer 40 and the film layer 30.

Figure 12:
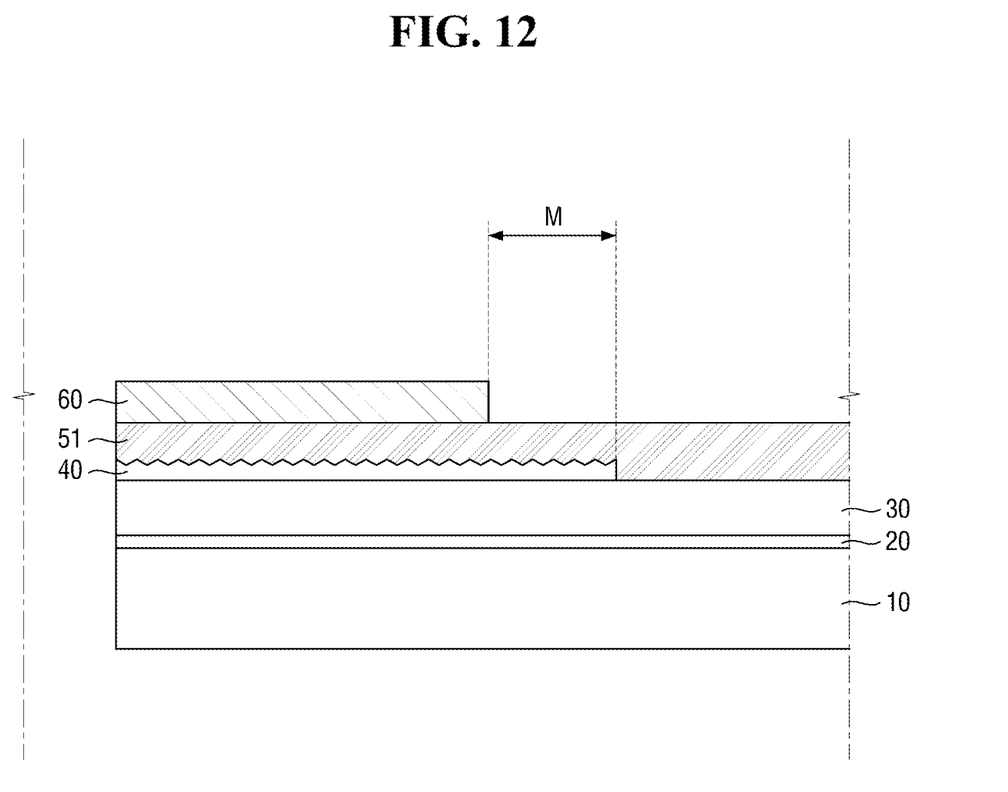

Referring to FIG. 12, a first print layer 60 is formed on the inorganic deposition layer 51. The first print layer 60 may be formed on a part of an area where the inorganic deposition layer 51 overlaps the mold layer 40. That is, the first print layer 60 may be formed to have a size that is smaller than that of the mold layer 40 (e.g., smaller by a margin M).

The first print layer 60 may be formed by screen-printing an ink having a color capable of blocking light on the inorganic deposition layer 51.

Figure 13:
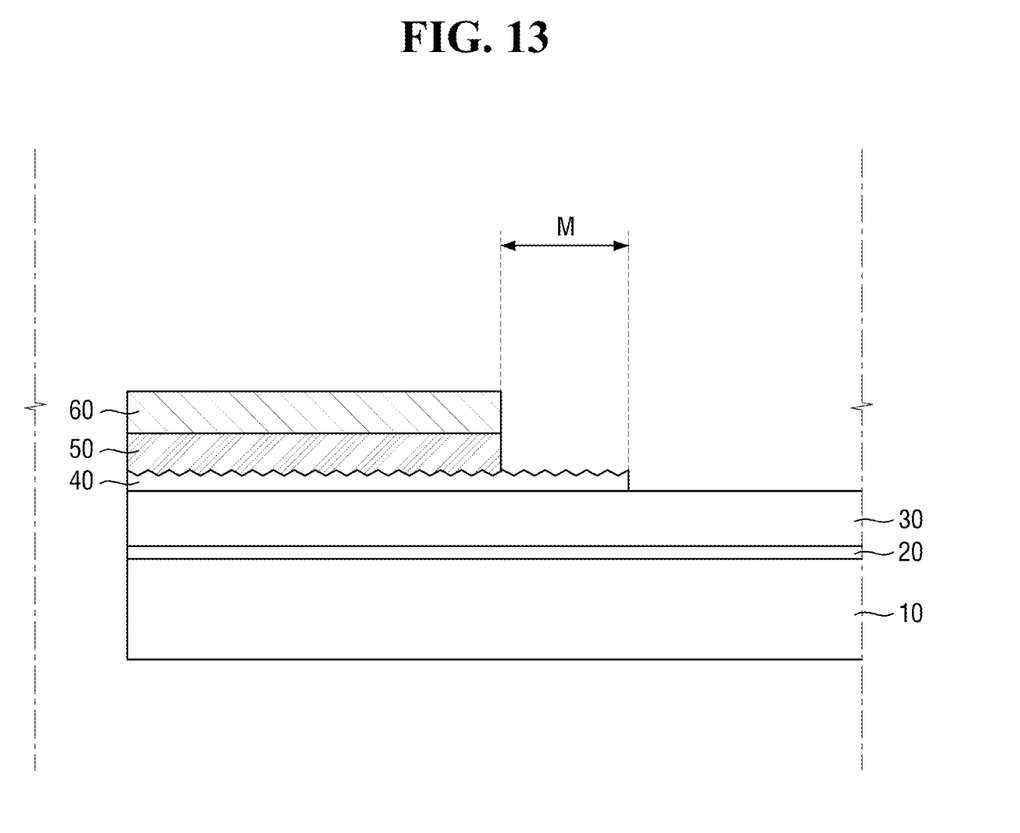

Referring to FIG. 13, next, the inorganic deposition layer 51 is etched using the first printed layer 60 as a mask. Therefore, the portions of the inorganic deposition layer 51 on which the first print layer 60 is not formed may be removed, so as to form an inorganic material pattern layer 50 covered with the first print layer 60. Further, the surface of the mold layer 40 may be exposed by the margin M.

This inorganic material pattern layer 50 may be formed by an NCVM process, but the present invention is not limited thereto.

Figure 14:
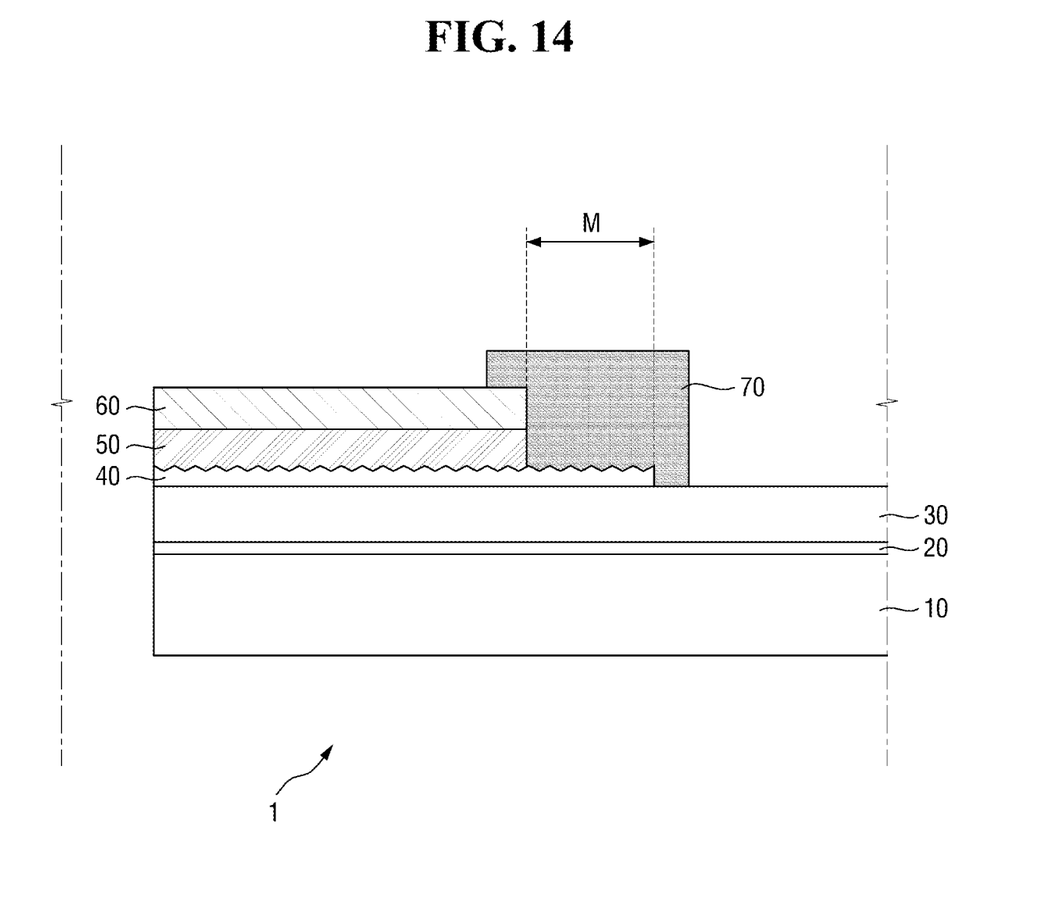

Referring to FIG. 14, next, a second print layer 70 may be formed on the exposed portion of the mold layer 40 so as to form the cover window 1 shown in FIGS. 1 and 2. The exposed portion of the mold layer 40 may be in direct contact with the second print layer 70. The second print layer 70 may directly cover a part of the first print layer 60 or the film layer 30.

The second print layer 70 may be formed by screen-printing an ink having a color capable of blocking light on the exposed portion of the mold layer 40.

As described above, according to embodiments of the present invention, the inorganic material pattern layer in the cover window for a display device is formed narrower than the mold layer by a margin or offset, and the exposed portion of the mold layer is covered with the print layer, thereby preventing a phenomenon in which a golden band is visually recognized or in which visibility is deteriorated in the cover window.

The aspects of embodiments of the present invention are not limited by the foregoing, and other various effects are anticipated herein.

Although the embodiments of the present invention have been disclosed for illustrative purposes, those skilled in the art will appreciate that various modifications, additions and substitutions are possible, without departing from the scope and spirit of the invention as disclosed in the accompanying claims, with functional equivalents thereof to be included.

What is claimed is:

1. A cover window for a display device, the cover window comprising:
    a light-transmitting substrate;
    a mold layer on at least a part of an edge of the light-transmitting substrate, and having an uneven pattern formed on a surface thereof;
    an inorganic material pattern layer on a first surface of the mold layer, and formed to be narrower than the mold layer by a margin to expose a portion of the first surface of the mold layer; and
    a print layer on the first surface of the mold layer and covering the exposed portion of the first surface of the mold layer.

2. The cover window of claim 1, wherein the exposed portion comprises a part of an inner side of the mold layer on a plane.

3. The cover window of claim 1, wherein the print layer covers at least a part of the inorganic material pattern layer.

4. The cover window of claim 3, wherein the print layer completely covers the mold layer and the inorganic material pattern layer.

5. The cover window of claim 1, wherein an inner line of the print layer overlaps an inner line of the mold layer on a plane.

6. The cover window of claim 1, wherein the mold layer is entirely located on a pair of opposite edges of the light-transmitting substrate.

7. The cover window of claim 6, wherein a flat mold layer having only smooth surfaces is on an edge of the light-transmitting substrate, the edge not being provided thereon with the mold layer.

8. The cover window of claim 6, wherein the print layer is on all edges of the light-transmitting substrate.

9. The cover window of claim 1, wherein the print layer comprises a color for substantially blocking visible light.

10. The cover window of claim 1, further comprising a masking print layer on the inorganic material pattern layer, and completely overlapping the inorganic material pattern layer.

11. The cover window of claim 10, wherein the print layer covers at least a part of the masking print layer.

* * * * *